(12) United States Patent
Li

(10) Patent No.: US 11,616,064 B2
(45) Date of Patent: Mar. 28, 2023

(54) SEMICONDUCTOR STRUCTURE

(71) Applicants: Semiconductor Manufacturing International (Shanghai) Corporation, Shanghai (CN); SMIC New Technology Research and Development (Shanghai) Corporation, Shanghai (CN)

(72) Inventor: Yong Li, Shanghai (CN)

(73) Assignees: Semiconductor Manufacturing International (Shanghai) Corporation, Shanghai (CN); SMIC New Technology Research and Development (Shanghai) Corporation, Shanghai (CN)

( * ) Notice: Subject to any disclaimer, the term of this patent is extended or adjusted under 35 U.S.C. 154(b) by 36 days.

(21) Appl. No.: 17/019,956

(22) Filed: Sep. 14, 2020

(65) Prior Publication Data

US 2020/0411519 A1    Dec. 31, 2020

Related U.S. Application Data

(62) Division of application No. 16/106,222, filed on Aug. 21, 2018, now Pat. No. 10,811,414.

(30) Foreign Application Priority Data

Aug. 24, 2017    (CN) .......................... 201710735050.8

(51) Int. Cl.
*H01L 27/092* (2006.01)
*H01L 29/417* (2006.01)
(Continued)

(52) U.S. Cl.
CPC .. *H01L 27/0924* (2013.01); *H01L 21/823431* (2013.01); *H01L 21/823821* (2013.01);
(Continued)

(58) Field of Classification Search
CPC ......... H01L 21/823821; H01L 27/0924; H01L 29/7848
See application file for complete search history.

(56) References Cited

U.S. PATENT DOCUMENTS 5,049,975 A * 9/1991 Ajika ................ H01L 23/53223
                                                              257/751
5,624,870 A * 4/1997 Chien ................ H01L 21/7684
                                                              438/653

(Continued)

FOREIGN PATENT DOCUMENTS

| CN | 101414632 A | 4/2009 |
| CN | 102117834 A | 7/2011 |
| CN | 105529269 A | 4/2016 |

*Primary Examiner* — Bilkis Jahan
*Assistant Examiner* — Victor V Barzykin
(74) *Attorney, Agent, or Firm* — Anova Law Group, PLLC

(57) ABSTRACT

A semiconductor structure is provided. The semiconductor structure includes a base substrate including a semiconductor substrate having a PMOS region and an NMOS region and a plurality of fins on the semiconductor substrate, a gate layer across the plurality of fins by covering portions of top and sidewall surfaces of the fins, a P-type doped epitaxial layer formed in the fins at both sides of the gate layer in the PMOS region, an N-type doped epitaxial layer formed in the fins at both sides of the gate layer in the NMOS region, and an N-region mask layer formed on sidewall surfaces of the N-type doped epitaxial layer and covering the P-type doped epitaxial layer. A portion of the N-type doped epitaxial layer exposed by the N-region mask layer is processed by an N-type dopant segregated Schottky doping process.

10 Claims, 10 Drawing Sheets

(51) Int. Cl.
  *H01L 29/78* (2006.01)
  *H01L 29/66* (2006.01)
  *H01L 21/8238* (2006.01)
  *H01L 21/8234* (2006.01)
  *H01L 21/84* (2006.01)

(52) U.S. Cl.
  CPC .. *H01L 29/41791* (2013.01); *H01L 29/66795* (2013.01); *H01L 29/785* (2013.01); *H01L 29/7848* (2013.01); *H01L 21/845* (2013.01)

(56) References Cited

U.S. PATENT DOCUMENTS

| | | | |
|---|---|---|---|
| 5,847,463 A * | 12/1998 | Trivedi | H01L 21/76895 257/E21.507 |
| 5,929,526 A * | 7/1999 | Srinivasan | H01L 21/76844 257/E21.585 |
| 5,998,873 A * | 12/1999 | Blair | H01L 23/485 257/766 |
| 10,002,796 B1 | 6/2018 | Su et al. | |
| 10,388,573 B2 * | 8/2019 | Li | H01L 29/7853 |
| 2009/0194816 A1 * | 8/2009 | Onoda | H01L 21/823864 257/E21.632 |
| 2015/0091059 A1 * | 4/2015 | Hung | H01L 29/785 257/192 |
| 2015/0380556 A1 | 12/2015 | Ching | |
| 2016/0043225 A1 * | 2/2016 | Ching | H01L 29/66545 438/283 |
| 2016/0111537 A1 * | 4/2016 | Tsai | H01L 21/26506 257/192 |
| 2016/0197075 A1 * | 7/2016 | Li | H01L 21/823807 257/369 |
| 2017/0125543 A1 | 5/2017 | Greene et al. | |

* cited by examiner

SEMICONDUCTOR STRUCTURE

CROSS-REFERENCES TO RELATED APPLICATIONS

This application is a divisional of U.S. patent application Ser. No. 16/106,222, filed on Aug. 21, 2018, which claims the priority of Chinese patent application No. 201710735050.8, filed on Aug. 24, 2017, the entirety of which is incorporated herein by reference.

FIELD OF THE DISCLOSURE

The present disclosure generally relates to the field of semiconductor manufacturing technologies and, more particularly, relates to semiconductor structures and fabrication methods.

BACKGROUND

In the manufacturing of integrated circuits (ICs), after forming semiconductor devices, the devices are connected together to form a circuit. With the repaid development of the IC manufacturing technologies, the demanding for a higher device density and a better performance has been continuously increased. To increase the integration level of the devices and reduce the production cost, the critical dimension (CD) of the device has been continuously reduced; and the circuit density in an IC chip has been continuously increased. Accordingly, the surface of the wafer may be unable to provide enough area for forming the interconnect lines to form regular circuits.

To meet the requirements of the interconnect lines after reducing the CD, the electrical connections between different metal layers and/or the electrical connections between the metal layers and the devices are often formed by interconnect structures. An interconnect structure often includes at least one interconnect line and at least one contact plug inside a contact through hole. The interconnect line connects with the contact plugs of different semiconductor structures to form electrical circuits.

With the continuous shrinking of the technical node and the device size, the contact area of the contact plug is continuously reduced. Accordingly, the contact resistance between the contact plug and the semiconductor device is continuously increased; and the electrical properties of the semiconductor device are adversely affected. Currently, to reduce the contact resistance between the contact plug and the semiconductor device (e.g., the doped epitaxial layer), a metal silicide process is introduced. The metal silicide layer has a substantially small resistivity; and is able to significantly reduce the contact resistance. Accordingly, the driving current of the semiconductor structure is increased.

However, the effect of the metal silicide layer for reducing the contact resistance has certain limitations. The contact resistance of the semiconductor structure needs to be further reduced. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor structure. The method includes providing a base substrate including a semiconductor substrate and a plurality of fins on the semiconductor substrate. The semiconductor substrate may have a PMOS region and an NMOS region. The method also includes forming a gate layer across the fins by covering portions of top and side surfaces of the fins; forming a P-type doped epitaxial layer in the fins at both sides of the gate layer in the PMOS region; forming an N-region mask layer on top and side surfaces of the fin in the NMOS region and covering the P-type doped epitaxial layer; and removing a portion of the N-region mask layer on top surfaces of the fins at both sides of the gate layer and a partial thickness of the fins in the NMOS region. The remaining fins in the NMOS region and the N-region mask layer may form an N-region trench. Further, the method includes forming an N-type doped epitaxial layer by filling the N-region trench; forming an interlayer dielectric layer covering the gate layer, the P-type doped epitaxial layer and the N-type doped epitaxial layer on the semiconductor substrate; etching the interlayer dielectric layer at both sides of the gate layer to form a contact opening to expose the P-type doped epitaxial layer and the N-type doped epitaxial layer; and performing an N-type dopant segregated Schottky (DSS) doping process on a portion of the N-type doped epitaxial layer exposed by the contact opening.

Another aspect of the present disclosure includes a semiconductor structure. The semiconductor structure includes a base substrate including a semiconductor substrate and a plurality of fins on the semiconductor substrate. The semiconductor substrate may have a PMOS region and an NMOS region. The semiconductor structure may also include a gate layer across the plurality of fins by covering portions of top and side surfaces of the fins; a P-type doped epitaxial layer formed in the fins at both sides of the gate layer in the PMOS region; an N-type doped epitaxial layer formed in the fins at both sides of the gate layer in the NMOS region; and an N-region mask layer formed on sidewall surfaces of the N-type doped epitaxial layer and covering the P-type doped epitaxial layer. The portion of the N-type doped epitaxial layer exposed by the N-region mask layer is processed by an N-type dopant segregated Schottky doping process.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

The present disclosure provides a semiconductor structure and a method for forming the semiconductor structure. In the disclosed method, an N-type dopant segregated Schottky (DSS) doping process may be performed on the N-type doped epitaxial layer exposed by the contact opening. Thus, the Schottky barrier height (SBH) may be reduced. Accordingly, the contact resistance of the NMOS transistor may be reduced; and the performance of the NMOS transistor may be improved. Further, the N-region mask may be used as a mask during the N-type DSS doping process. Thus, no extra mask may be needed for the N-type DSS doping process; and the production cost may be reduced.

Figure 17:
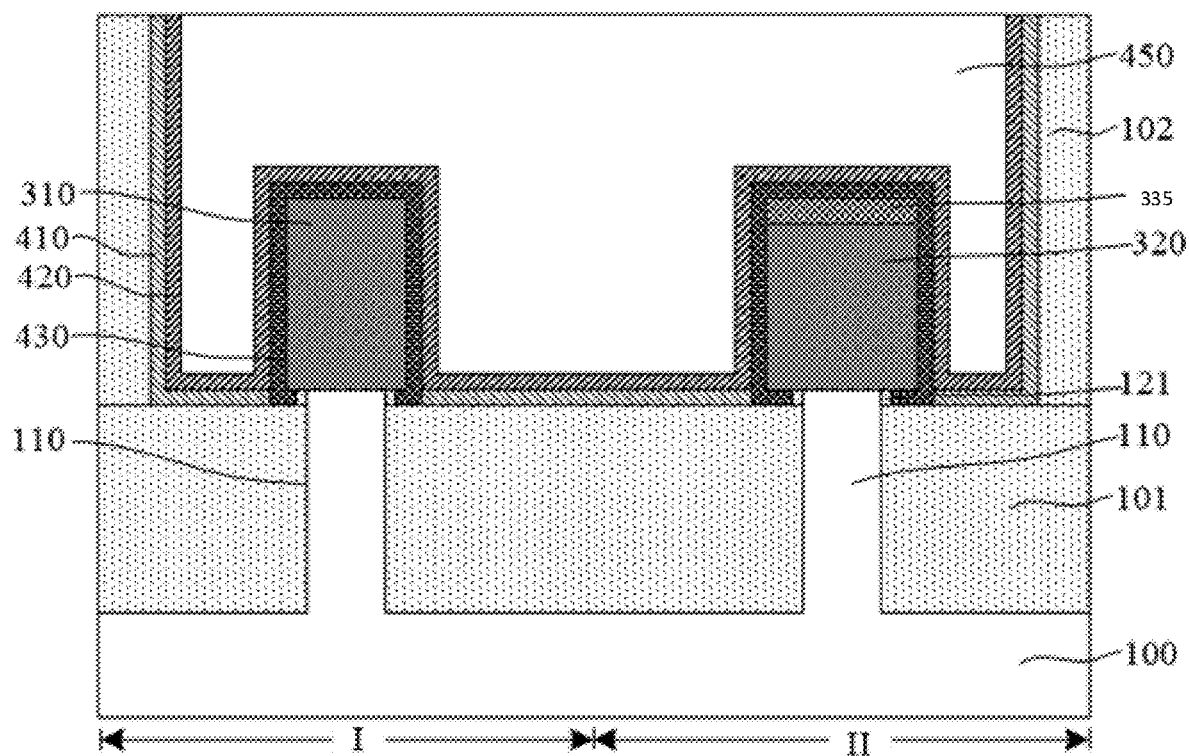
Figure 18:
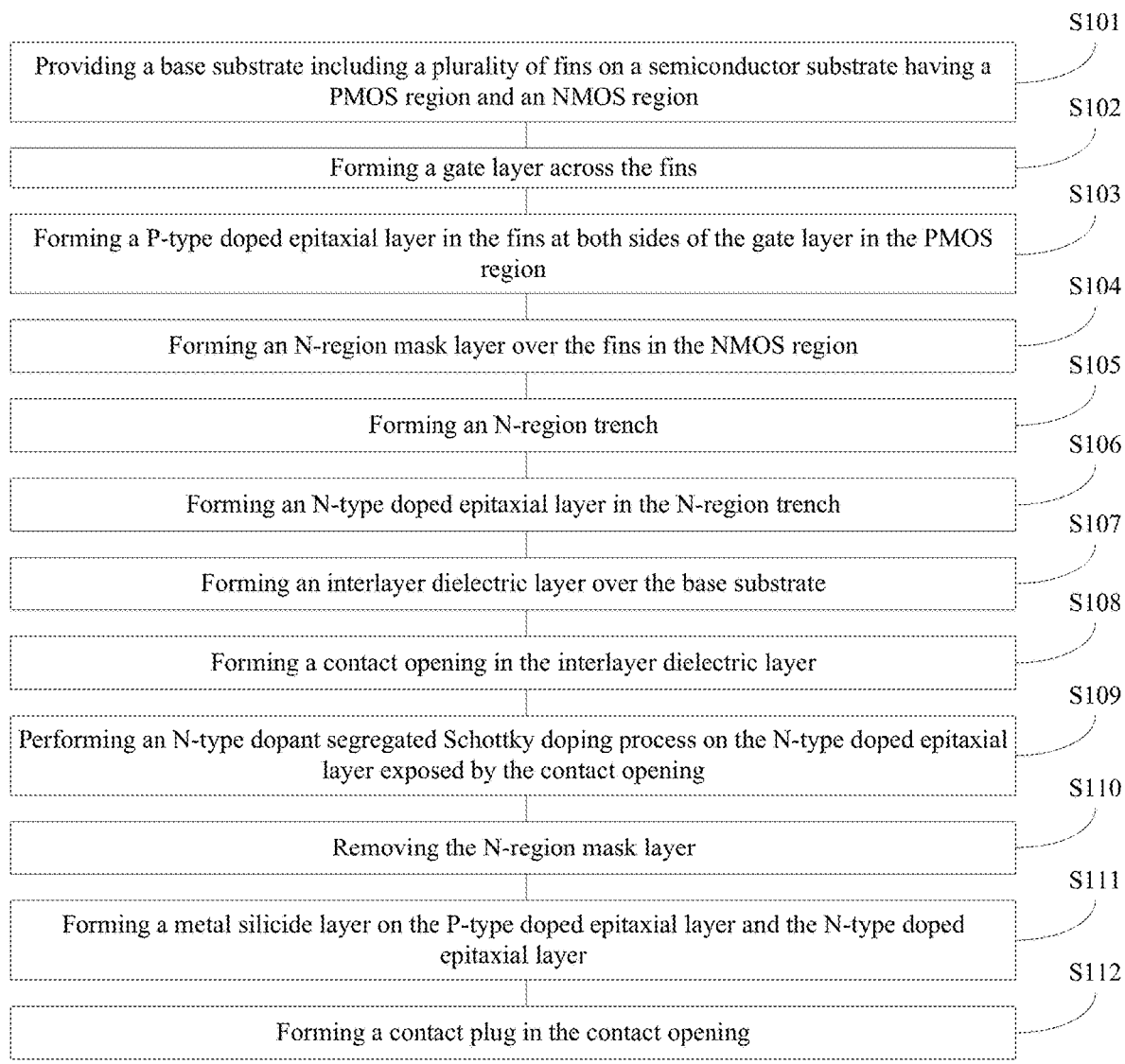
FIG. 18 illustrates an exemplary fabrication process of a semiconductor structure consistent with various disclosed embodiments.

FIG. 18 illustrates an exemplary fabrication process of a semiconductor structure consistent with various disclosed embodiments. FIGS. 1-17 illustrate structures corresponding to certain stages during the exemplary fabrication process.

Figure 1:
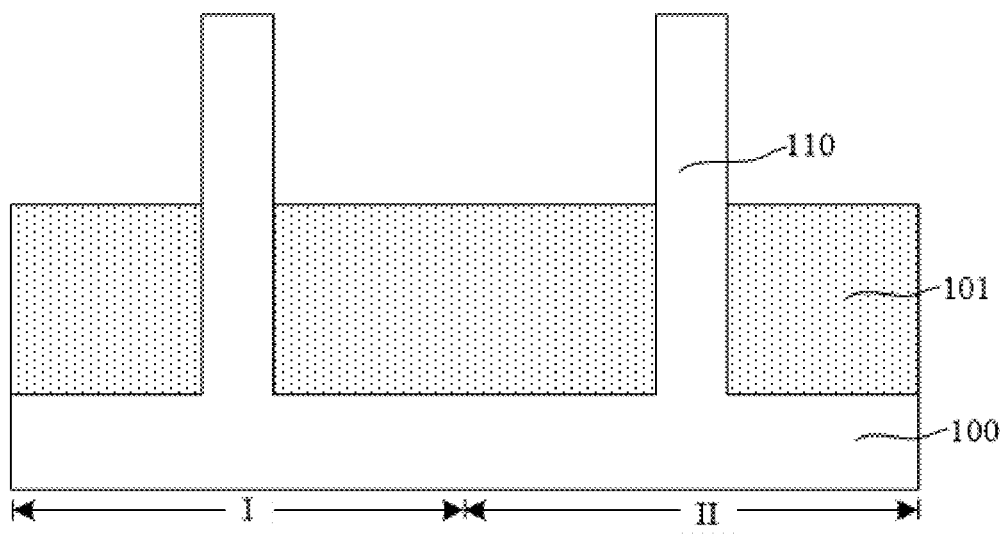
FIGS. 1-17 illustrate structures corresponding to certain stages during an exemplary fabrication process of a semiconductor structure consistent with various disclosed embodiments.

As shown in FIG. 18, at the beginning of the fabrication process, a base substrate with certain structures is provided (S101). FIG. 1 illustrates a corresponding semiconductor structure.

As shown in FIG. 1, a base substrate is provided. The base substrate may include a semiconductor substrate 100 and a plurality of fins 110 formed on the semiconductor substrate 100. The semiconductor substrate 100 may include a PMOS region I and an NMOS region II.

The semiconductor substrate 100 provides a process platform for forming the semiconductor structure. The channel of the semiconductor structure may be located in the fins 110.

For example, the PMOS region I may be used to form a P-type metal oxide semiconductor (PMOS) device. The NMOS region II may be used to form an NMOS device.

In one embodiment, the semiconductor substrate 100 is made of single crystal silicon. In some embodiments, the semiconductor substrate may be made of polysilicon, amorphous silicon, amorphous germanium, germanium, silicon germanium, silicon carbide, gallium arsenide, or gallium indium, etc. In other embodiments, the semiconductor substrate may be a silicon on insulator (SOI) substrate, a germanium on insulator (GOI) substrate, or a glass substrate, etc. The material of the semiconductor substrate may be a material that meets the process requirements and is easy to be integrated.

In one embodiment, the fins 110 and the semiconductor substrate 100 are made of a same material, for example, single crystal silicon. In some embodiments, the fin and the semiconductor substrate may be made of different materials. The fins may be made of other appropriate semiconductor material, such as silicon, germanium, silicon germanium, or silicon carbide, gallium arsenide, or gallium indium, etc.

In one embodiment, the PMOS region I is adjacent to the NMOS region II. In some embodiments, the PMOS region and the NMOS region may be isolated from each other.

In one embodiment, after providing the base substrate, isolation structures, such as shallow trench isolation (STI) structures 101, may be formed on the semiconductor substrate 100. The top surfaces of the STI structures 101 may be lower than the top surfaces of the fins 110.

The STI structures 101 may be used as the isolation structures of the semiconductor device to isolate adjacent devices and/or adjacent fins 110 from each other. In one embodiment, the STI structures 101 are made of silicon oxide. In some embodiments, the STI structures may be made of silicon nitride, or silicon oxynitride, etc.

Figure 2:
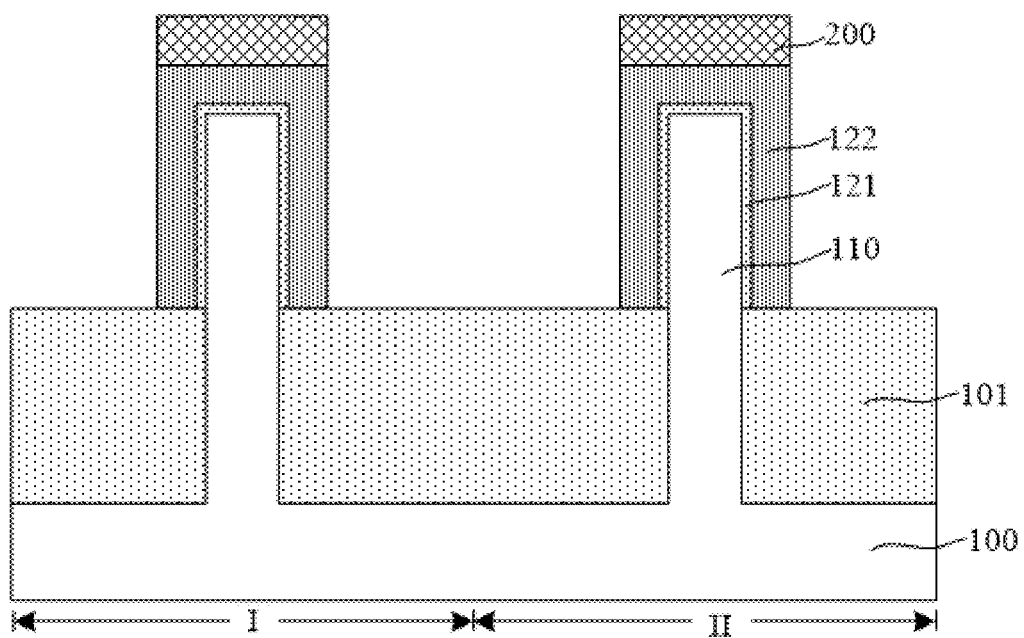

Returning to FIG. 18, after providing the base substrate, a gate layer may be formed (S102). FIG. 2 illustrates a corresponding semiconductor structure.

As shown in FIG. 2, a gate layer 122 may be formed. The gate layer 122 may be across the fins 110 by covering portions of the top surfaces and sidewall surfaces of the fins 110.

The gate layer 122 may occupy a space for subsequently forming the a metal gate structure of the semiconductor structure. The gate layer 122 may also be a portion of the subsequently formed gate structure of the semiconductor structure.

In one embodiment, the gate layer 122 is made of polysilicon. In some embodiments, the gate layer may also be made of silicon oxide, silicon nitride, silicon oxynitride, silicon carbide, silicon carbonitride, silicon oxycarbonitride, or amorphous carbon, etc. In other embodiments, the gate layer may be made of a metal material.

In one embodiment, before forming the gate layer 122, a gate dielectric layer 121 may be formed. The gate dielectric layer 121 may be across the fins 110 by covering the top surfaces and the sidewall surfaces of the fins 110.

In one embodiment, the gate dielectric layer 121 is a gate oxide layer; and the gate dielectric layer 121 is made of silicon oxide. In some embodiments, the gate dielectric layer may be made of silicon oxynitride. In other embodiments, when the gate layer is made of a metal material, the gate dielectric layer may be made of a gate dielectric material, such as a high-dielectric constant (high-K) material, etc.

The process for forming the gate layer 122 may include forming a gate material layer on the gate dielectric layer 121; forming a gate mask layer 200 (as shown in FIG. 2) on the surface of the gate material layer; and etching the gate material layer using the gate mask layer 200 as a mask to expose the gate dielectric layer 121. Thus, the gate layer 122 may be formed on the gate dielectric layer 121; and the gate layer 122 may be across the fins 110 and cover the portions of the top surfaces of the fins 110 and the portions of the sidewall surfaces of the fins 110.

In one embodiment, after forming the gate layer 122, the portion of the gate dielectric layer 121 exposed by the gate layer 122 may remain in place. In some embodiments, after forming the gate layer, the portion of the gate dielectric layer exposed by the gate layer may be removed; and the portion of the gate dielectric layer covered by the gate layer may be retained.

In one embodiment, after forming the gate layer 122, the gate mask layer 200 may be retained. The gate mask layer 200 may be made of silicon nitride. The gate mask layer 200 may be used to protect the top surface of the gate layer 122 during the subsequent processes.

Figure 3:
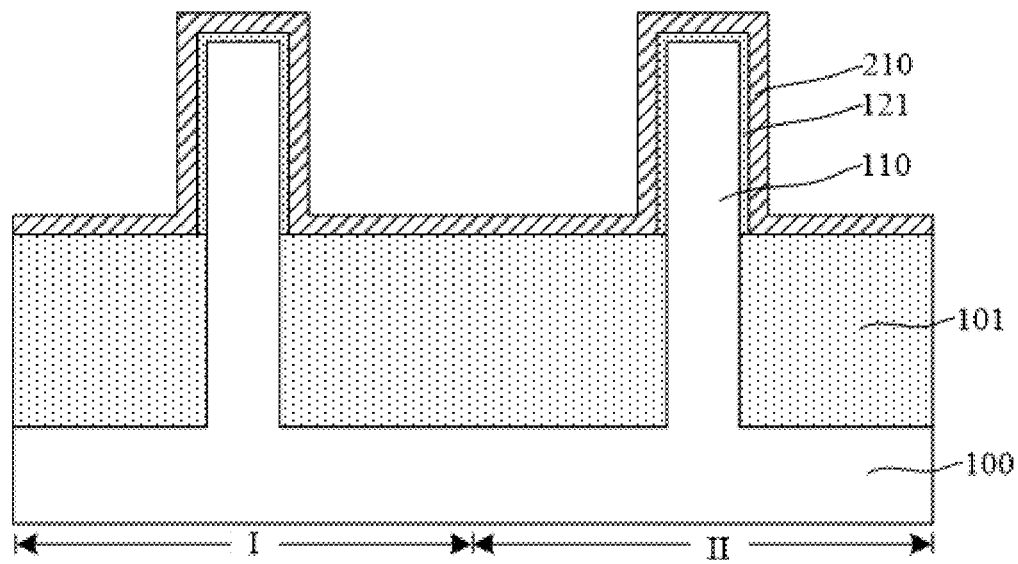

Returning to FIG. 18, after forming the gate layer, a P-type doped epitaxial layer may be formed (S103). FIGS. 3-6 illustrate structures corresponding to certain stages during forming the epitaxial layer. FIG. 3 illustrates a cross-sectional view of the semiconductor structure along a direction perpendicular to a length direction perpendicular to the fin 110, cross-sectioned outside of the gate layer 122. That is, FIG. 2 and FIG. 3 illustrate two different cross-sections of the semiconductor structure along the length direction of the fin 110. The cross-section in FIG. 2 is across the region that has the gate layer and the gate mask layer of the semiconductor structure. The cross-section in FIG. 3 is across the region that does not have the gate layer and the gate mask layer of the semiconductor structure.

The process for forming the epitaxial layer may include forming a P-region mask layer; forming a P-region trench and forming a P-type doped material in the P-region trench by an epitaxial growth process to form an P-type doped epitaxial layer.

Figure 4:
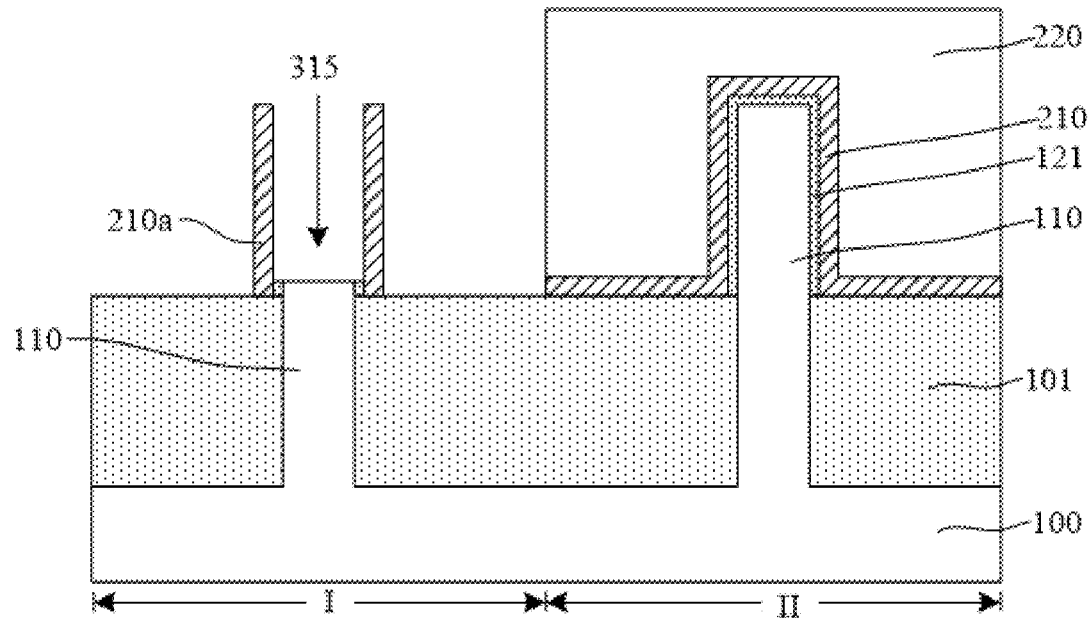

As shown in FIG. 3, after forming the gate layer 122 (as shown in FIG. 2), a mask material layer 210 may be formed. The mask material layer 210 may be formed on the top surfaces and the side surfaces of the fins 110. Then, portions of the mask material layer 210 on the top surfaces of the fins 110 at both sides of the gate layer 122 in the PMOS region I may be removed by an etching process to expose the top surfaces of the fins 110 at both sides of the gate layer 122 in the PMOS region I to form a P-region mask layer 210a and a partial thickness of the fins 110 in the PMOS region I may also be removed by the etching process to form a P-region trench 315 (as shown in FIG. 4).

The P-region mask layer 210a may be used as an etching mask for etching the fins 110 in the PMOS region I; and to define the width of the P-region trench 315. Further, the portions of the P-region mask layer 210a on the sidewall surfaces of the fins 110 may protect the sidewall surfaces of the fins 110 to prevent an epitaxial growth on the sidewall surfaces of the fins 110 during a subsequent selective epitaxial growth process.

The mask material layer 210 may be made of any appropriate material, such as silicon nitride, silicon oxide, boron nitride, silicon oxycarbonitride, silicon boron oxycarbonitride, or silicon oxynitride, etc. The material of the mask material layer 210 may be different from the material of the fins 110; and the material of the mask material layer 210 may also be different from the material of the STI structures 101. In one embodiment, the mask material layer 210 is made of silicon nitride; and the thickness of the mask material layer 210 may be in a range of approximately 5 nm-10 nm.

In one embodiment, the mask material layer 210 may also be formed on the top surfaces and the sidewall surfaces of the fins 110 in the NMOS region II. Further, the mask material layer 210 may be formed on the top surface and the sidewall surfaces of the gate layer 122 in the PMOS region I, the top surface and the sidewall surfaces of the gate layer 122 in the NMOS region II and the STI structures 101.

Various processes may be used to form the mask material layer 210, such as a chemical vapor deposition (CVD) process, a physical vapor deposition (PVD) process, or an atomic layer (ALD) process, etc. In one embodiment, the P-region mask layer 210 is formed by an ALD process.

The portions of the P-region mask layer 210 on the top surfaces of the fins 110 at both sides of the gate layer 122 in the PMOS region I may be removed by any appropriate process. In one embodiment, a dry etching process is used to remove the portions of the mask material layer 210 on the top surfaces of the fins 110 at both sides of the gate layer 122 in the PMOS region I to form the P-region mask layer 210a. When etching the mask material layer 210, the portions of the mask material layer 210 on the top surfaces of the gate layer 122 in the PMOS region I and the STI structures 101 may also be etched. After the top surfaces fins 110 at both sides of the gate layer 122 in the PMOS region I are exposed, the partial thickness of the fins 110 (i.e., the top portions of the fins 110) may be continuously etched to form the P-region trench 315.

When forming the P-region trench 315, the portions of the gate dielectric layer 121 on the top surfaces of the fins 110 and the sidewall surfaces of the fins 110 may also be etched. For example, the portions of the gate dielectric layer 121 higher than the remaining fins 110 in the PMOS region I may be removed.

In one embodiment, as shown in FIG. 4, before etching the mask material layer 210 to form the P-region mask layer 210a, a first photoresist layer 220 may be formed over the NMOS region II. The first photoresist layer 220 may cover the mask material layer 210 in the NMOS region II. The first photoresist layer 220 may protect the mask material layer 210 in the NMOS region II; and the first photoresist layer 220 may also cover the regions that are not expected to be etched in the PMOS region I.

Further, when removing the partial thickness of the fins 110, the partial thickness should be an appropriate value. The P-region trench 315 may be surrounded (or formed) by the fins 110 and the P-region mask layer 210a. If the fins 110 are etched too small, the depth of the P-region trench 315 may be too small. Thus, the volume of the subsequently formed P-type doped epitaxial layer may be too small. Accordingly, the resistance of the P-type epitaxial layer may be too large; and the contact resistance of the PMOS structure may be too large. Further, the channel of the subsequently formed PMOS device may be located in the fins 110. If the fins 110 are etched too much, the height of the remaining fins 110 may be too small; and the performance of the PMOS device may be adversely affected.

Thus, in one embodiment, after removing the partial thickness of the fins 110, the height difference between the top surfaces of the remaining fins 110 and the top surfaces of the STI structures 101 may be in a range approximately from −3 nm to 3 nm. When the height difference is a negative value, the top surfaces of the remaining fins 110 is lower than the top surfaces of the STI structures 101. When the height difference is a positive value, the top surfaces of the remaining fins 110 is higher than the top surfaces of the STI structures 101.

In one embodiment, after forming the P-region trench 315, the first photoresist layer 220 may remain in place. The first photoresist layer 220 may be able to protect the NMOS region II during the subsequent processes.

Figure 5:
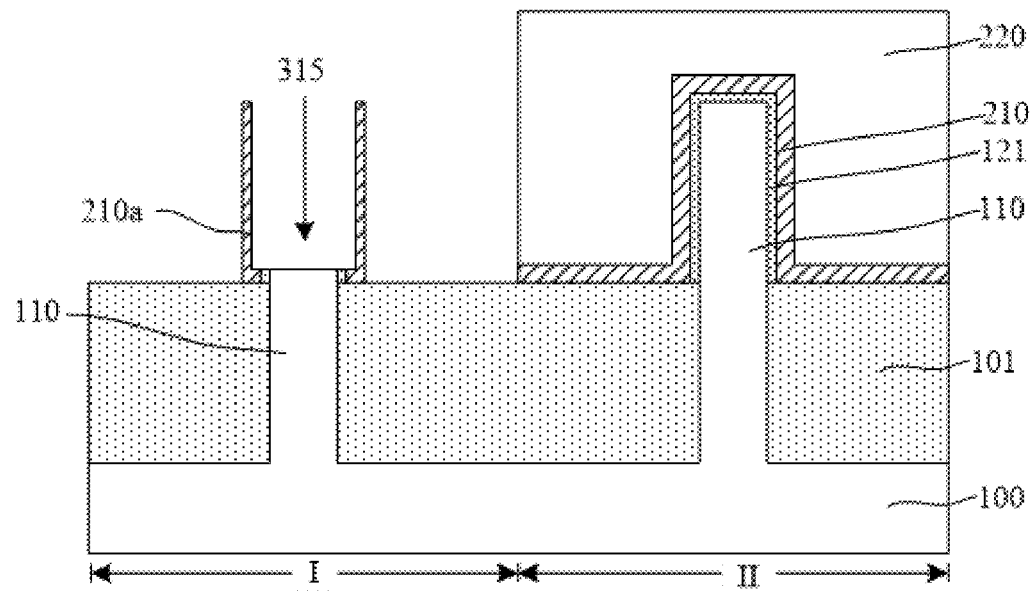

Further, as shown in FIG. 5, after forming the P-region trench 315, a pull-back process may be performed on the P-region mask layer 210a on the sidewalls of the P-region trench 315.

In one embodiment, the pull-back process may be defined as a first pull-back process. The first pull-back process may be used to increase the width of the P-region trench 315. The width of the P-region trench 315 refers to the size of the P-region trench 315 along the direction perpendicular to the length direction of the fins 110.

Through the first pull-back process, the volume of the P-region trench 315 may be increased. Correspondingly, the volume of the subsequently formed P-type doped epitaxial layer may be increased; and the resistance of the P-type doped epitaxial layer may be reduced. Further, the area of the top surface of the P-type doped epitaxial layer 310 may be increased. Thus, the contact resistance of the PMOS device may be reduced.

In one embodiment, the first pull-back process may be a wet etching process. The P-region mask layer 210a may be made of silicon nitride; and the etching solution of the wet etching process may be a phosphoric acid solution. In some embodiments, the first pull-back process may be a dry etching process.

In one embodiment, to ensure the reduction effect of the contact resistance and to avoid the falling off of the P-region mask layer 210a simultaneously, after the first pull-back process, the thickness of the P-region mask layer 210a may be in a range of approximately 3 nm-7 nm.

In one embodiment, under the constrain of the P-region mask layer 210, a P-type doped epitaxial layer may be subsequently formed in the P-region trench 315. The possibility of for having a bridge issue between the gate layer 122 (referring to FIG. 2) and the P-type doped epitaxial layer caused by the substantially large volume of the P-type doped epitaxial layer may be reduced.

In one embodiment, after the first pull-back process, the first photoresist layer 220 may be removed. The first photoresist layer 220 may be removed by an ashing process, or a wet etching process, etc.

Figure 6:
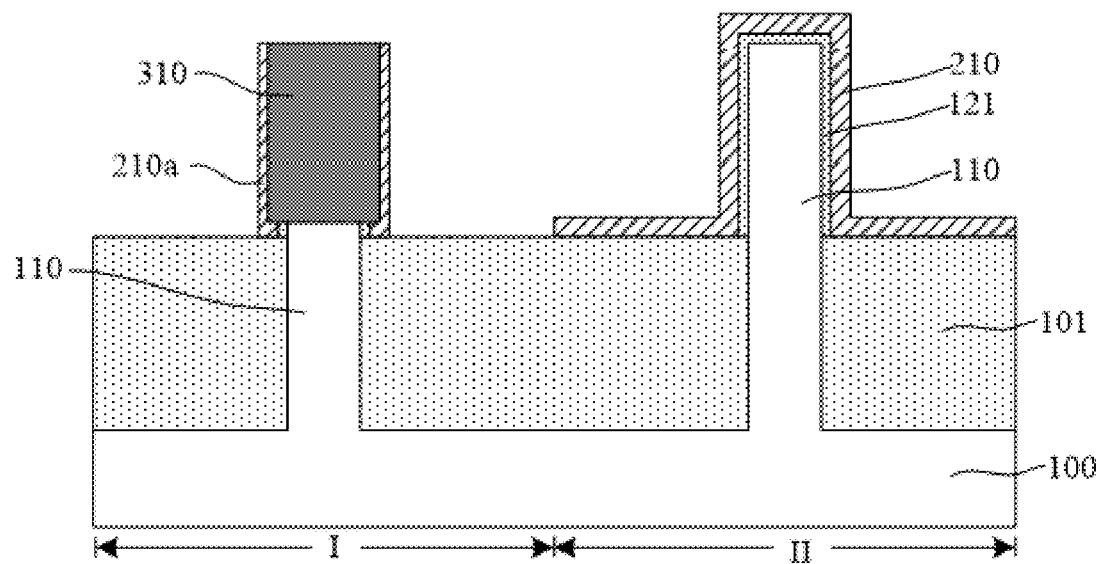

As shown in FIG. 6, after forming the P-region trench 315, a P-type doped epitaxial layer 310 may be formed in the P-region trench 315. That is, the P-type doped epitaxial layer 310 may be formed in the fins 110 at both sides of the gate layer 122 in the PMOS region I (referring to FIG. 2). The P-type doped epitaxial layer 310 may be used to form the source region and/or the drain region of the PMOS device.

In one embodiment, a first stress layer may be formed in the P-region trench 315 by an epitaxial (EPI) growth process. When forming the first stress layer, the stress layer may be in situ doped with P-type ions to form the P-type doped epitaxial layer 310. In some embodiments, a P-type ion implantation process may be performed on the first stress layer after forming the first stress layer to form the doped epitaxial layer.

The first stress layer may provide a compressive stress to the channel region of the PMOS device. Thus, the carrier mobility of the PMOS device may be increase.

The first stress layer may be made of Si or SiGe, etc. The P-type ions may include at least one of B ions, Ga ions, and In ions, etc. The doping concentration of the P-type ions may be determined according to the practical process requirements. In one embodiment, the first stress layer is made of SiGe; and the P-type ions are B ions. Correspondingly, the P-type epitaxial layer 310 may be made of SiGeB.

Figure 7:
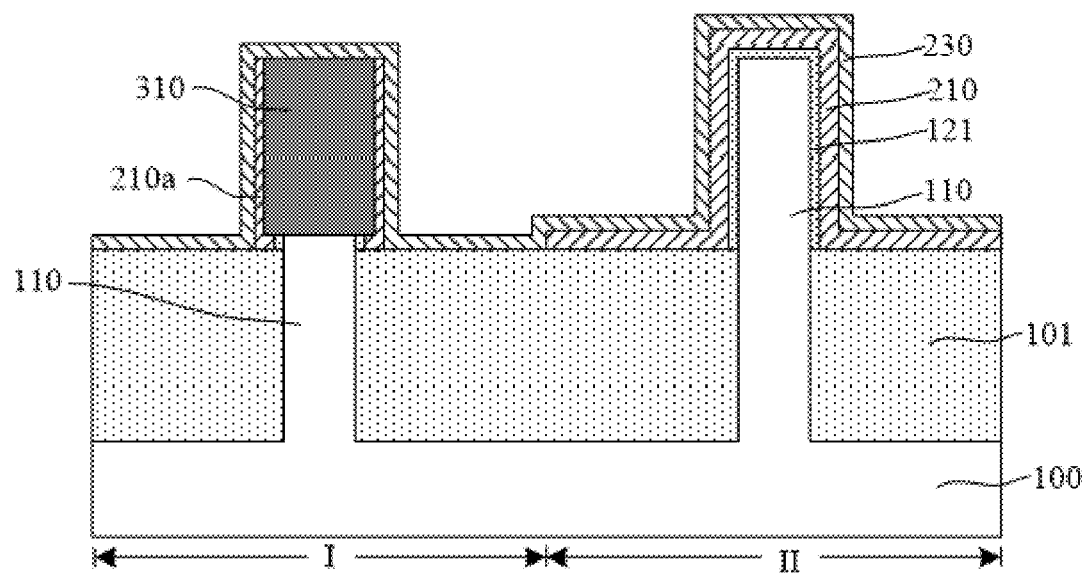

Returning to FIG. 18, after forming the P-type doped epitaxial layer, an N-region mask layer may be formed (S104). FIG. 7 illustrates a corresponding semiconductor structure.

As shown in FIG. 7, an N-region mask layer is formed on the top surfaces and the sidewall surfaces of the fins 110 in the NMOS region II. The N-region mask layer may include a remaining portion of the mask material layer 210 in the NMOS region II and an N-region covering mask layer.

The process for forming the N-region mask layer may include forming the N-region covering mask layer 230 on the portion of the mask material layer 210 in the NMOS region II. The stacked structure including the mask material layer 210 in the NMOS region II and the N-region covering mask layer 230 forms the N-region mask layer.

In one embodiment, the N-region covering mask layer 230 may also cover the P-type doped epitaxial layer 310 and the P-region mask layer 210a in the PMOS region I. Further, the N-region covering mask layer 230 may cover the STI structures 101 and the gate layer 122 (referring to FIG. 2) in the PMOS region I.

The N-region covering mask layer 230 may be made of silicon nitride, silicon oxide, boron nitride, silicon oxynitride, silicon boron oxycarbonitride, or silicon oxycarbonitride, etc. In one embodiment, to improve the process compatibility, the N-region covering mask layer 230 may be made of a material the same as the material of the mask material layer 210. The N-region covering mask layer 230 may be made of silicon nitride. The process for forming the N-region covering mask layer 230 may be referred to the process for forming the P-region mask layer 210a.

In one embodiment, the thickness of the N-region mask layer may be in a range of approximately 8 nm-16 nm so as to reduce the possibility for the N-region mask layer to fall off during the subsequent etching process; and to allow the N-region mask layer to have a desired filling effect at the corners of the interfaces between the fins 110 and the STI structures 101.

The thickness of the N-region covering mask layer 230 may be determined according to the thickness of the mask material layer 210 in the NMOS region II and the requirements for the total thickness of the N-region mask layer. In one embodiment, the thickness of the N-region covering mask layer 230 may be in a range of approximately 2 nm-6 nm.

Figure 8:
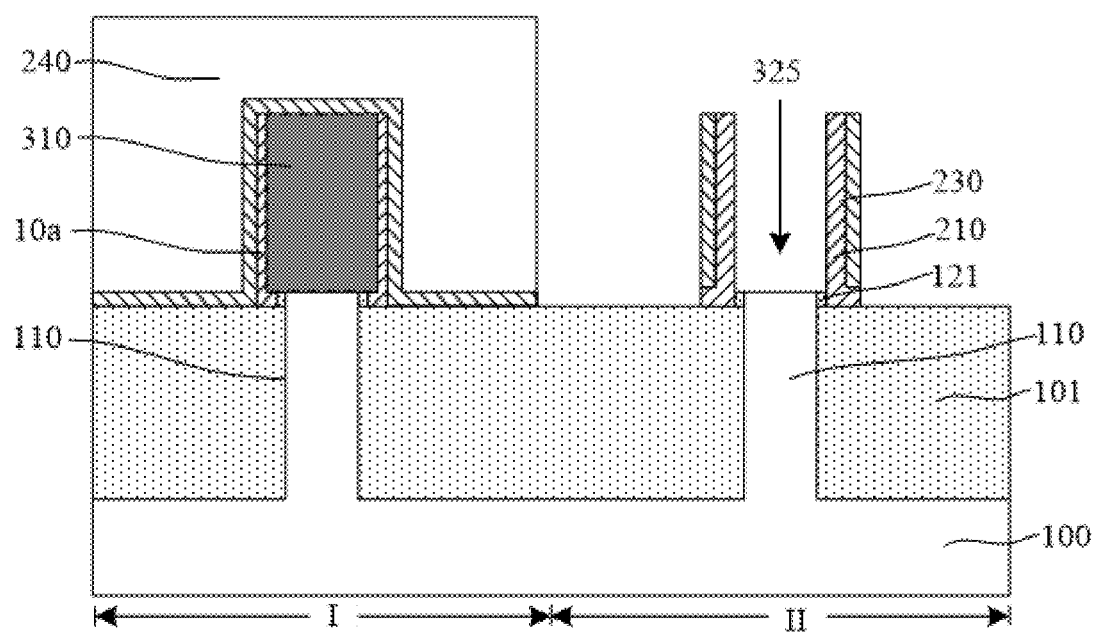

Returning to FIG. 18, after forming the N-region mask layer, an N-region trench may be formed (S105). FIG. 8 illustrates a corresponding semiconductor structure.

As shown in FIG. 8, after forming the N-region mask layer, portions of the N-region mask layer on the top surfaces of the fins 110 at both sides of the gate layer 122 (referring to FIG. 2) in the NMOS region II may be removed; and the top surfaces of the fins 110 at two sides of the gate layer 122 in the NMOS region II may be exposed. Further, a partial thickness of the fins 110 in the NMOS region II may be removed.

The remaining fins 110 in the NMOS region II and the remaining N-region mask layer may form an N-region trench 325. The N-region trench 325 may provide a spatial space for subsequently forming an N-type doped epitaxial layer.

In one embodiment, the portions of the N-region mask layer on the top surfaces of the fins 110 at both sides of the gate layer 122 in the NMOS region II may be removed by a dry etching process. When etching the portions of the N-region mask layer, the portions of the N-region mask layer on the top surface of the gate layer 122 in the NMOS region II and the top surfaces of the STI structures 101 may also be etched. After exposing the top surfaces of the fins 110 at both sides of the gate layer 122 in the NMOS region II, the partial thickness of the exposed fins 110 (i.e., the top portion) may be further etched to form the N-region trench 325.

When forming the N-region trench 325, the portions of the gate dielectric layer 121 on the top and sidewall surfaces of the fins 110 in the NMOS region II may also be etched. For example, the portions of the gate dielectric layer 121 above the top surfaces of the remaining fins 110 may be removed.

Referring to FIG. 8, before etching the N-region mask layer, a second photoresist layer 240 may be formed over the PMOS region I. The second photoresist layer 240 may cover the portion of the N-region covering mask layer 230 in the PMOS region I. The second photoresist layer 240 may protect the PMOS region I. The second photoresist region 240 may also cover the regions of the NMOS region II that are not expected to be etched.

In one embodiment, after etching to remove the top portion of the fins 110 in the NMOS region II, the height difference between the top surfaces of the remaining fins 110 in the NMOS region II and the top surfaces of the STI structures 101 may be in a range approximately from −3 nm to 3 nm. Thus, when subsequently increasing the volume of the N-type doped epitaxial layer, the issue of too mall height of the remaining fins 110 in the NMOS region II may be avoided; and the adverse effect to the performance of the NMOS device may be avoided.

The process for removing the partial thickness of the fins 110 in the NMOS region II may be referred to the process for forming the P-region trench 315 (as shown in FIG. 4).

Figure 9:
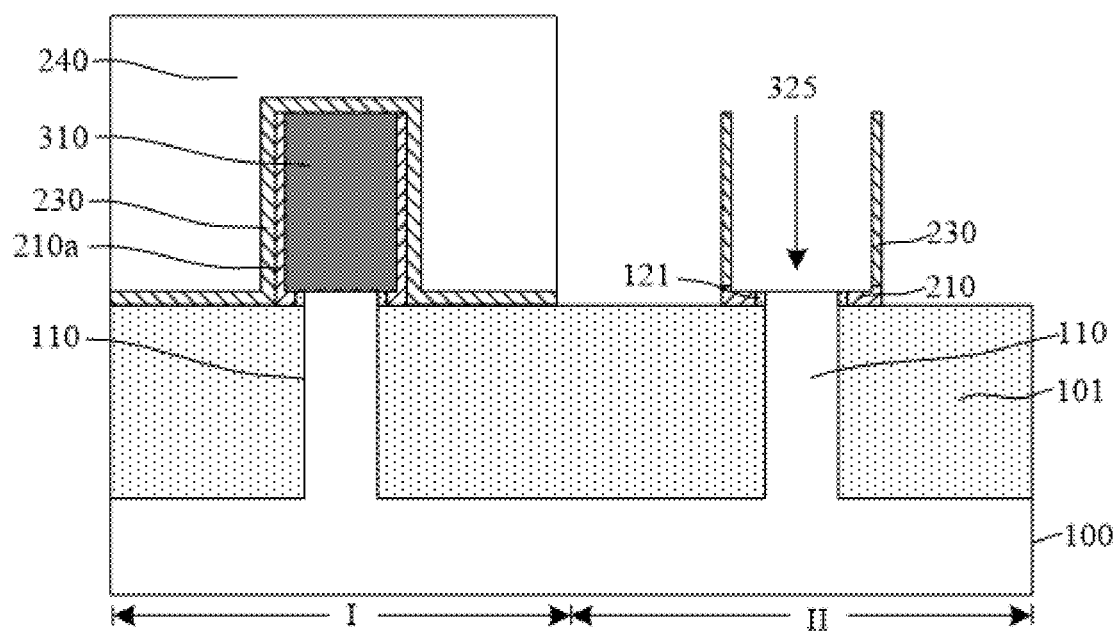

Further, as shown in FIG. 9, after forming the N-region trench 325, a pull-back process may be performed on the N-region mask layer on the sidewall surfaces of the N-region trench 325. In one embodiment, such a pull-back process may be referred to as a second pull-back process. The second pull-back process may be used to increase the width of the N-region trench 325. The width of the N-region trench 325 may refer to the size of the N-region trench 325 along the direction perpendicular to the length direction of the fins 110.

Through the second pull-back process, the volume of the N-region trench 325 may be increased. Correspondingly, the volume of the N-type doped epitaxial layer subsequently formed in the N-region trench 325 may be increased. Thus, the resistance of the N-type doped epitaxial layer may be reduced; and the area of the top surface of the N-type doped epitaxial layer may be increased. Accordingly, the contact resistance of the NMOS device may be reduced.

In one embodiment, the second pull-back process may be a wet etching process. The N-region mask layer may be made of silicon nitride. Thus, the etching solution of the wet etching process may correspondingly be a phosphoric acid solution. In some embodiments, the second pull-back process may be a dry etching process.

To avoid the falling off of the N-region mask layer on the fins 110 in the NMOS region II when subsequently forming the N-type doped epitaxial layer, the thickness of the N-region mask layer should not be too small. However, if the thickness of the N-region mask layer is still substantially large after the second pull-back process, the effect for reducing the contact resistance may not be sufficient. Thus, in one embodiment, after the second pull-back process, the thickness of the N-region mask layer may be in a range of approximately 4 nm-10 nm.

In one embodiment, after the first pull-back process, the second photoresist layer 240 may be removed. The second photoresist layer 240 may be removed by any appropriate process, such as an ashing process, or a wet etching process.

Figure 10:
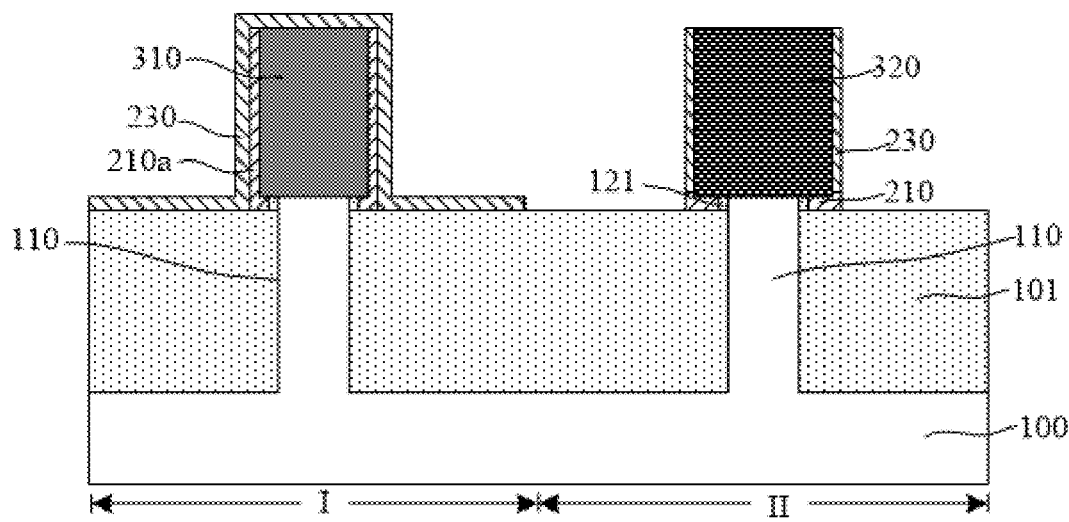

Returning to FIG. 18, after forming the N-region trench, an N-type doped epitaxial layer may be formed (S106). FIG. 10 illustrates a corresponding semiconductor structure.

As shown in FIG. 10, an N-type doped epitaxial layer 320 is formed. The N-type doped epitaxial layer 320 may fill the N-region trench 325. The N-type doped epitaxial layer 320 may be used as the source region and/or the drain region of the NMOS device.

The N-type doped epitaxial layer 320 may be formed by forming a second stress layer in the N-region trench 325 by a selective epitaxial growth process; and in-situ doping N-type ions when forming the second stress layer. In some embodiments, the second stress layer may be doped by an N-type ion implantation process to form the N-type doped epitaxial layer.

The second stress layer may be made of Si or SiC, etc. The N-type ions may include at least one of P ions, As ion and Sb ions, etc. The doping concentration of the N-type ions may be determined according to the practical process requirements. In one embodiment, the second stress layer is made of Si; and the N-type ions are P ions. Correspondingly, the N-type doped epitaxial layer 320 may be made of SiP.

In one embodiment, under the constrain of the N-region mask layer (not labeled), the N-type doped epitaxial layer 320 may be formed in the N-region trench 325. Thus, the possibility for having a bridge issue between the N-type doped epitaxial layer 320 and the gate layer 122 caused by the too large size of the N-type doped epitaxial layer 320 may be significantly reduced.

Figure 11:
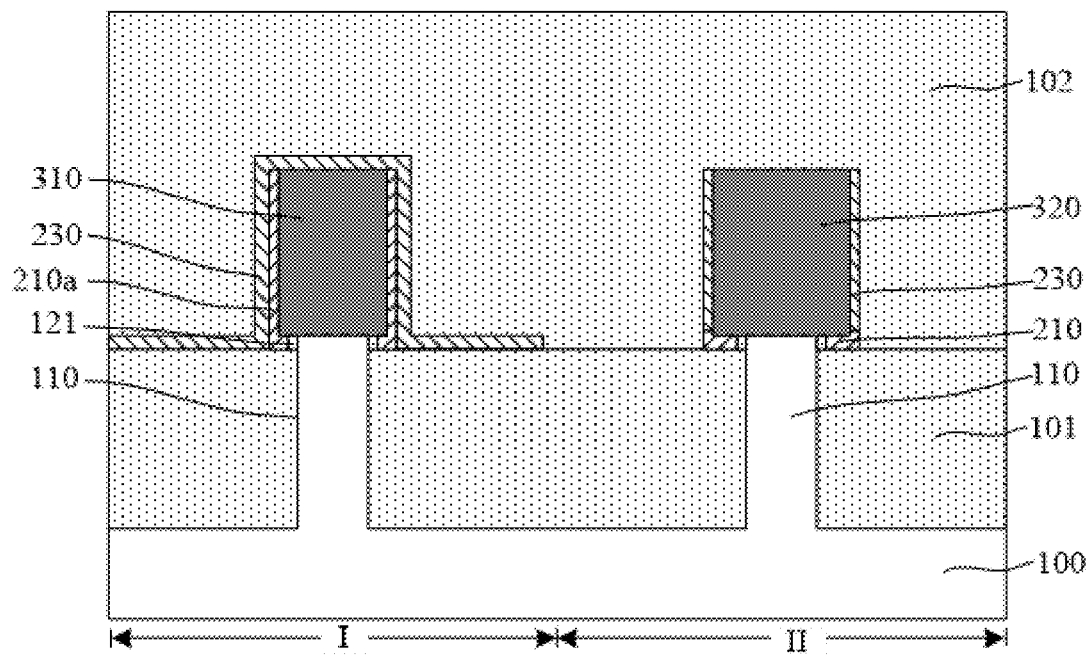

Returning to FIG. 18, after forming the N-type doped epitaxial layer, an interlayer dielectric layer may be formed (S107). FIG. 11 illustrates a corresponding semiconductor structure.

As shown in FIG. 11, an interlayer dielectric layer 102 may be formed over the semiconductor substrate 100. The interlayer dielectric layer 102 may cover the gate layer 122 (referring to FIG. 2), the P-type doped epitaxial layer 310 and the N-type doped epitaxial layer 320. The interlayer dielectric layer 102 may be used to electrically isolate adjacent semiconductor structures from each other.

The interlayer dielectric layer 102 may be made of an insulation material. In one embodiment, the interlayer dielectric layer 102 is made of silicon oxide. In some embodiments, the interlayer dielectric layer may be made of other dielectric material, such as silicon nitride, or silicon oxynitride, etc.

The process for forming the interlayer dielectric layer 102 may include forming a dielectric material layer over the semiconductor substrate 100 to cover the top surface of the gate layer 122 (as shown in FIG. 2); and planarizing the dielectric material layer. The remaining dielectric material layer after the planarization process may be configured as the interlayer dielectric layer 102; and the interlayer dielectric layer 102 may expose the top surface of the gate layer 122.

Because the gate mask layer 200 (referring to FIG. 2) may be formed on the top surface of the gate layer 122, during the planarization process, the gate mask layer 200 may also be removed. For example, the top surface of the interlayer dielectric layer 102 may level with the top surface of the gate layer 122.

Figure 12:
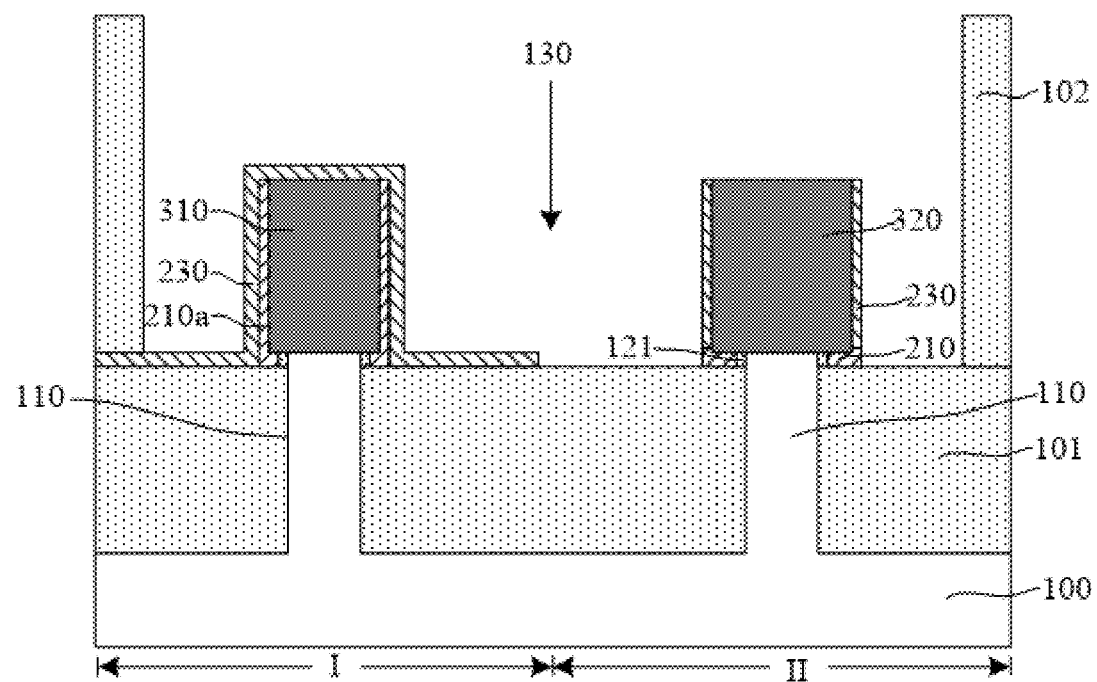

Returning to FIG. 18, after forming the interlayer dielectric layer, a contact opening may be formed (S108). FIG. 12 illustrates a corresponding semiconductor structure.

As shown in FIG. 12, a contact opening 130 may be formed in the interlayer dielectric layer 102 at both sides of the gate layer 122 (referring to FIG. 2). The contact opening 130 may be formed by etching the interlayer dielectric layer 102 at both sides of the gate layer 122 to expose the P-type doped epitaxial layer 310 and the N-type doped epitaxial layer 320.

The contact opening 130 may provide a spatial space for subsequently forming a contact plug (CT) electrically connected with the P-type doped epitaxial layer 310 and the N-type doped epitaxial layer 320; and provide a spatial space for subsequently forming a metal silicide layer.

In one embodiment, the PMOS region I may be adjacent to the NMOS region II. To increase the process window for subsequently forming the contact plug and reduce the process difficulty, the contact opening 130 may be across the PMOS region I and the NMOS region II. Correspondingly, the contact opening 130 may expose the N-region covering mask layer 230, the N-type doped epitaxial layer 320 and portions of the STI structures 101.

In some embodiments, the contact openings may correspond the P-type epitaxial layer and the N-type doped epitaxial layer, respectively.

Figure 13:
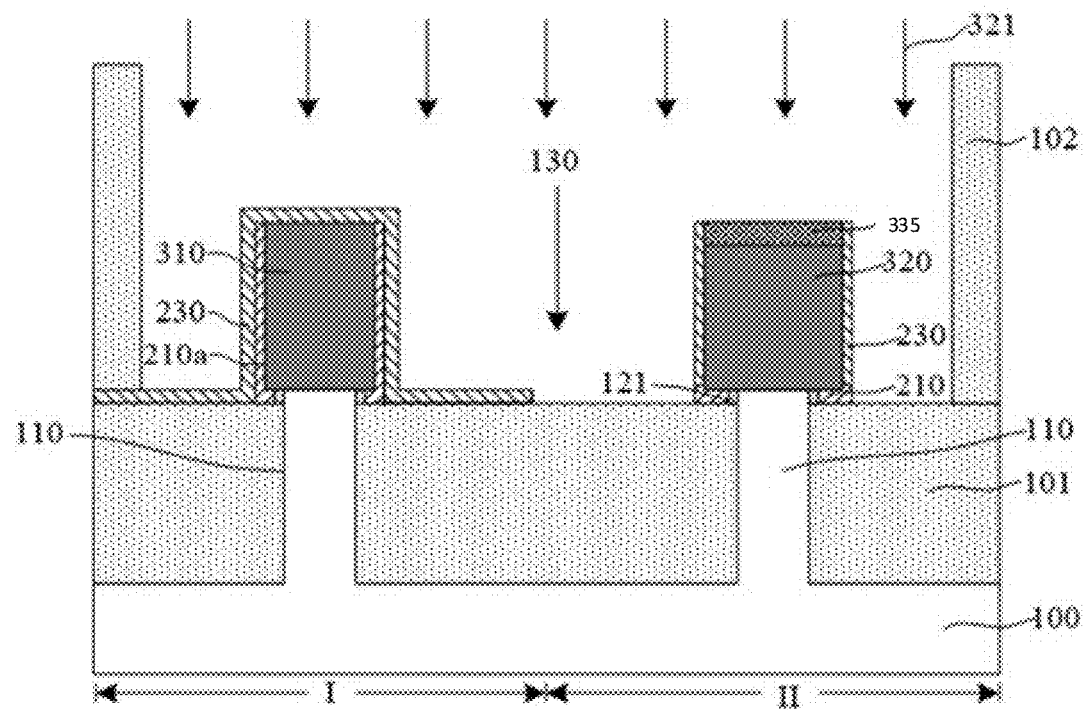

Returning FIG. 18, after forming the contact opening, an N-type dopant segregated Schottky doping process may be performed (S109). FIG. 13 illustrates a corresponding semiconductor structure.

As shown in FIG. 13, an N-type dopant segregated Schottky (DSS) doping process 321 may be performed on the N-type doped epitaxial layer 320 exposed by the contact opening 130. After the DSS doping process 321, along the direction from the top of the N-type doped epitaxial layer 320 to the bottom of the N-type doped epitaxial layer 320, a partial thickness of the N-type epitaxial layer 320 (the region 335 illustrated in FIG. 13) may be doped with certain doping ions.

During the subsequent process for annealing the metal silicide layer, the annealing process may allow the doping ions to segregate at the interface between the metal silicide layer and the N-type doped epitaxial layer 320. Thus, the Schottky barrier height (SBH) of the NMOS device may be reduced; and the contact resistance of the NMOS device may be reduced. Accordingly, the performance of the NMOS device may be improved.

In one embodiment, the thickness of the N-region covering mask layer 230 may be in a range of approximately 3 nm-8 nm. Thus, the N-type covering mask layer 230 may be able to function as a mask layer during the N-type DSS doping process 321 and may protect the regions that are not expected to be affected by the N-type DSS doping process 321. For example, the PMOS region I may be protected. Thus, when the SBH of the NMOS device is reduced, no extra mask may be needed for the N-type DSS doping process 321. Accordingly, the production cost may be reduced.

In one embodiment, the doping ions of the N-type DSS doping process 321 may include at least one of P ions, As ions and Sb ions. Because the atomic mass of P atom, As atom and Sb atom may be substantially small, the N-type DSS doping process 321 may achieve a substantially small implanting energy and a substantially large implanting dosage; and the implanting energy and the implanting dosage may be precisely controlled. Thus, when the process effect of the N-type DSS doping process is achieved, the doping damage to the N-type doped epitaxial layer 320 may be avoided.

In one embodiment, the N-type DSS doping process 321 may be an ion implantation process.

The doping depth of the N-type DSS doping process 321 may be any appropriate value. After subsequently forming the metal silicide layer, the doping ions of the N-type DSS doping process 321 may be expected to segregate at the interface between the metal silicide layer and the N-type doped epitaxial layer 320. Thus, if the doping depth is too small, the doping ions of the N-type DSS doping process 321 may be unable to segregate at the interface between the metal silicide layer and the N-type doped epitaxial layer 320. If the doping depth is too large, the process risk may be increased. For example, the N-type doped epitaxial layer 320 may be damaged by the N-type DSS doping process 321; and the doping ions of the N-type DSS doping process 321 may be also unable to segregate at the interface between the metal silicide layer and the N-type doped epitaxial layer 320. Thus, along the direction from the top of the N-type doped epitaxial layer 320 to the bottom of the N-type doped epitaxial layer 320, the doping depth of the N-type DSS doping process 321 may be in a range of approximately 1 nm-4 nm.

Correspondingly, according to the doping depth of the N-type DSS doping process 321, the implanting energy of the N-type DSS process 321 may be selected in a range of approximately 100 eV-1 keV.

Further, the implanting dosage of the N-type DSS doping process 321 may be any appropriate value. If the implanting dosage is too small, the effect for reducing the SBH may not be obvious. If the implanting dosage is too large, it may be difficult for the N-type doped epitaxial layer 320 to form metal silicide in the subsequent process; and the resistance of the N-type doped epitaxial layer 320 may be increased. Thus, in one embodiment, the implanting dosage of the N-type DSS doping process 321 may be in a range of approximately 1E14 atom/cm$^2$-1E16 atom/cm$^2$.

Figure 14:
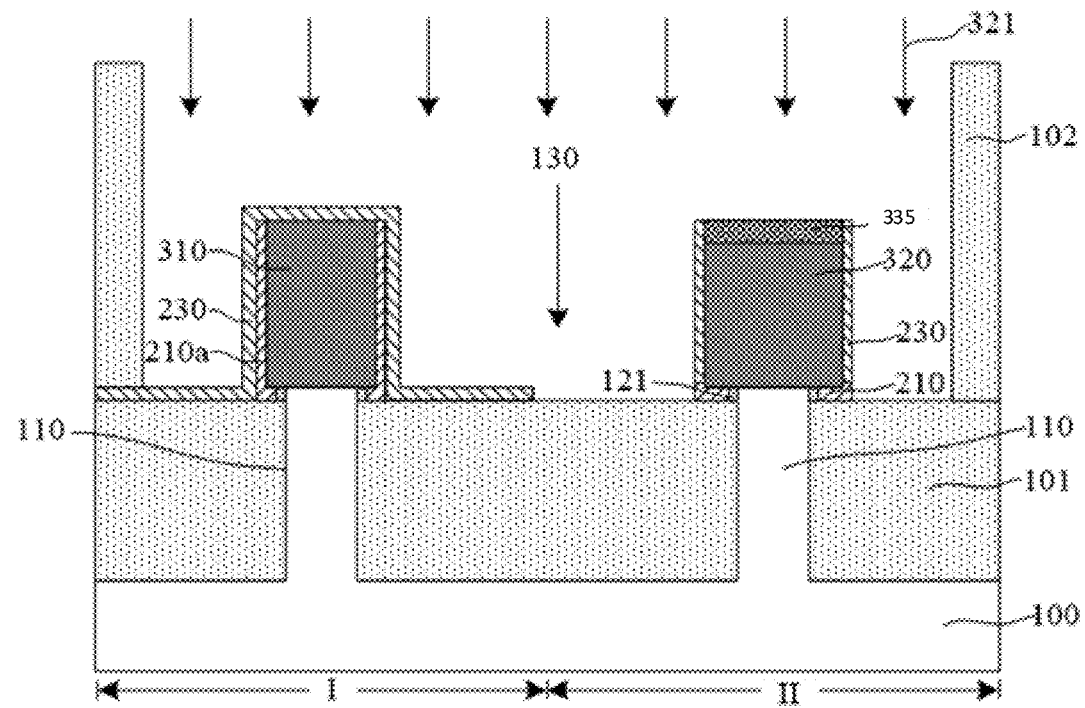

Returning to FIG. 18, after performing the N-type DSS doping process, the N-region mask layer may be removed (S110). FIG. 14 illustrates a corresponding semiconductor structure.

As shown in FIG. 14, the N-region mask layer is removed. For example, the P-region mask layer 210 in the PMOS region I and the N-region covering mask layer 230 may be removed to expose the P-type doped epitaxial layer 310 and the N-type doped epitaxial layer 320. Thus, a process base may be provided for subsequently forming a metal silicide layer and a contact plug.

The P-region mask layer 210 in the PMOS region I and the N-region covering mask layer 230 may be removed by any appropriate process. In one embodiment, a wet etching process is used to remove the P-region mask layer 210 in the PMOS region I and the N-region covering mask layer 230. The P-region mask layer 210 in the PMOS region I and the N-region covering mask layer 230 may be both made of silicon nitride. Thus, the etching solution of the wet etching process may be a phosphoric acid solution.

Figure 15:
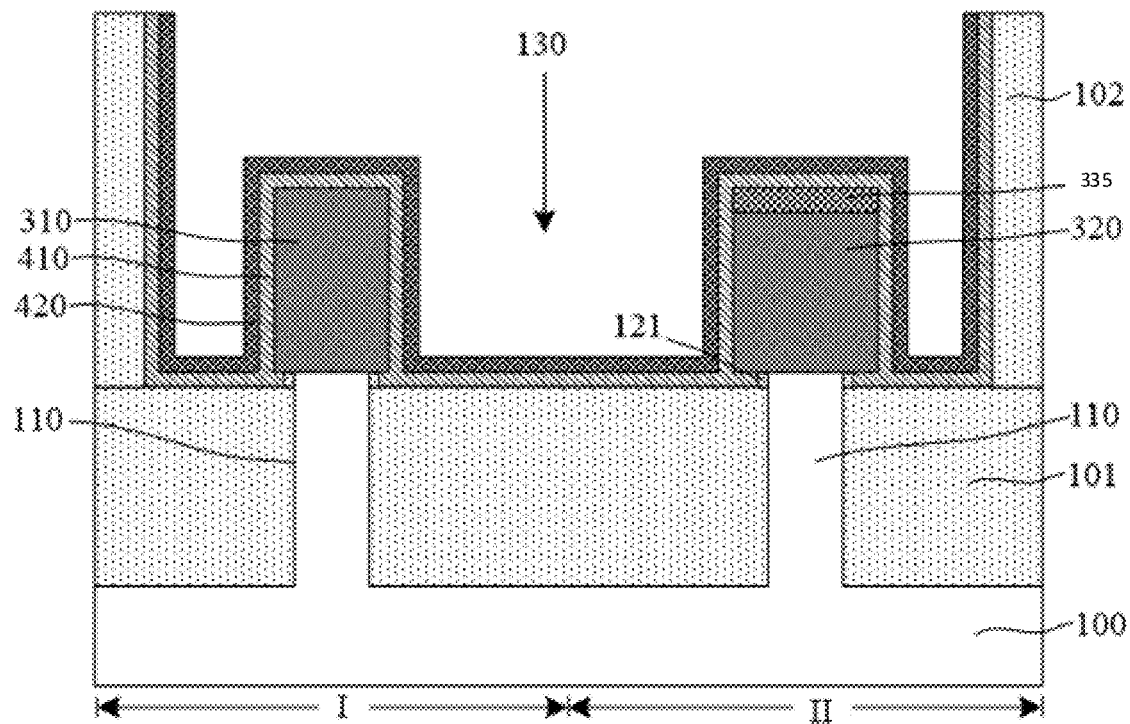
Figure 16:
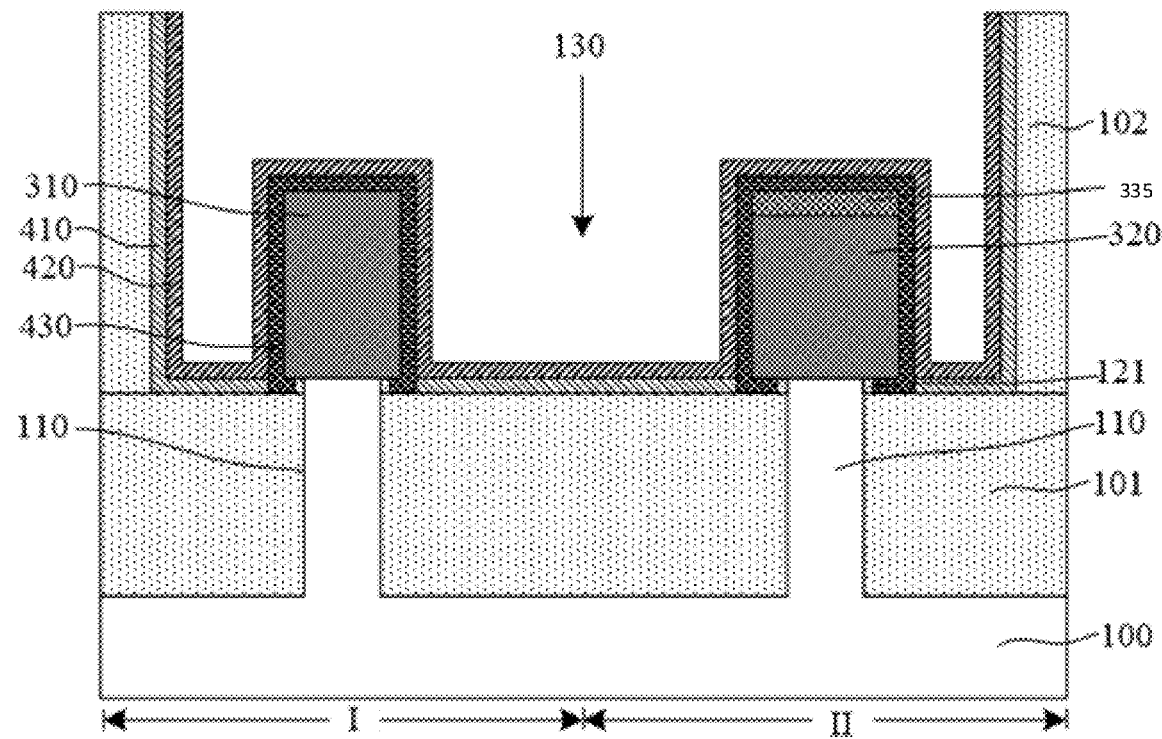

Returning to FIG. 18, after removing the P-region mask layer in the PMOS region I and the N-region covering mask layer. A metal silicide layer may be formed (S111). FIGS. 15-16 illustrate structures corresponding to certain stages when forming the metal silicide layer.

As shown in FIG. 15, after removing the P-region mask layer 210 in the PMOS region I and the N-region covering mask layer 230, a metal layer 410 may be formed on the bottom of the contact opening 130. Then, a barrier layer 420 may be formed on the metal layer 410.

The metal layer 410 may react with the N-type doped epitaxial layer 320 to form a metal silicide layer. Various processes may be used to form the metal layer 410, such as an atomic layer deposition (ALD) process, or a physical vapor deposition (PVD) process, etc.

The metal layer 410 may also be formed on the sidewall surfaces of the contact opening 130. The portion of the metal layer 410 on the bottom of the contact opening 130 may cover the P-type doped epitaxial layer 310 and the N-type doped epitaxial layer 320; and may also cover the top surfaces of the STI structures 101 exposed by the contact opening 130.

In one embodiment, the metal layer 410 is made of Ti. In some embodiments, the metal layer may also be made of Ni, Pt, or Co, etc.

Referring to FIG. 15, after forming the metal layer 410 and before a subsequently thermal annealing process, the barrier layer 420 may be formed on the metal layer 410. The barrier layer 420 may prevent a reaction between the precursors for subsequently forming a contact plug and the P-type doped epitaxial layer 310 and the N-type doped epitaxial layer 320 and a reaction between the precursors and the subsequently formed metal silicide layer. Further, the barrier layer 420 may be used to increase the adhesion property of the conductive material in the contact opening 130 during subsequently forming the contact plug.

The barrier layer 180 may be made of any appropriate material. In one embodiment, the barrier layer 180 is made of TiN.

Further, as shown in FIG. 16, after forming the barrier layer 180, a metal silicide layer 430 may be formed on the surfaces of the P-type doped epitaxial layer 310 and the N-type doped epitaxial layer 320 exposed by the contact opening 130. The metal silicide layer 430 may reduce the contact resistance between the subsequently formed contact plug and the P-type doped epitaxial layer 310 and the contact resistance between the subsequently formed contact plug and the N-type doped epitaxial layer 320.

For example, the metal silicide layer 430 may be formed by performing a thermal annealing process on the base substrate after forming the metal layer 410 and the barrier layer 420 to allow the metal layer 410 to react with the P-type doped epitaxial layer 310 and the N-type doped epitaxial layer 320. Accordingly, the metal silicide layer 430 may be formed.

In one embodiment, the metal layer 410 may react with Si in the P-type doped epitaxial layer 310 and the N-type doped epitaxial layer 320; and the metal layer 410 may be turned into the metal silicide layer 430. For example, the metal layer 410 is made of Ti; and the metal silicide layer 430 may be correspondingly made of TiSi.

In one embodiment, after forming the metal silicide layer 430, the non-react portion of the metal layer 410 may be retained.

Returning to FIG. 18, after forming the metal silicide layer, a contact plug may be formed (S112). FIG. 17 illustrates a corresponding semiconductor structure.

As shown in FIG. 17, after forming the metal silicide layer 430, a conductive material may be filled into the contact opening 130 (referring to FIG. 16) to form a contact plug 450. The contact plug 450 may electrically contact with the P-type doped epitaxial layer 310 and the N-type doped epitaxial layer 320.

The contact plug 450 may form an electrical connection with the P-type doped epitaxial layer 310 and an electrical connection with the N-type doped epitaxial layer 320. Further, the contact plug 450 may also form an electrical connection between devices.

In one embodiment, the contact plug 450 is made of W. Various processes may be used to form the contact plug 450, such as a sputtering process, or an electroplating process, etc. In some embodiments, the contact plug may be made of other conductive material, such as Al, Cu, Ag or Au, etc.

The present disclosure also provides a semiconductor structure. FIG. 13 illustrates an exemplary semiconductor structure consistent with various disclosed embodiments. Referring to FIG. 2, FIG. 13 is a cross-sectional view of the structure in FIG. 2 at one side of the gate layer and along the long direction of a fin.

As shown in FIG. 13, the semiconductor structure includes a base substrate. The base substrate may include a semiconductor structure 100 and a plurality of fins 110 on the semiconductor substrate 110. The semiconductor substrate 100 may include a PMOS region I and an NMOS region II. The semiconductor structure may also include a gate layer 122 (referring to FIG. 2) across the fins 110 by covering portions of the top and side surfaces of the fins 110. Further, the semiconductor structure may include a P-type doped epitaxial layer 310 formed in the fins 110 at both sides of the gate layer 122 in the PMOS region I; and an N-type doped epitaxial layer 320 formed in the fins 110 at both sides of the gate layer 122 in the NMOS region II. Further, the semiconductor structure may include N-region mask layer (not labeled) formed on the sidewall surfaces of the N-type doped epitaxial layer 320 and covering the P-type doped epitaxial layer 310. The portions of the N-type doped epitaxial layer 320 exposed by the N-region mask layer may be processed by an N-type dopant segregated Schottky (DSS) doping process.

For example, the PMOS region I of the semiconductor substrate 100 may be used to form a P-type metal oxide semiconductor (PMOS) device. The NMOS region II of the semiconductor substrate may be used to form an NMOS device. In one embodiment, the PMOS region I is adjacent to the NMOS region II. In some embodiments, the PMOS region I and the NMOS region II may be separated.

In one embodiment, the semiconductor structure may also include shallow trench isolation (STI) structures 101 formed on the semiconductor substrate 100. The top surfaces of the STI structures 101 may be below the top surfaces of the fins 110. The details of the semiconductor substrate 100, the fins 110 and the STI structures 101 may be referred to the previous descriptions.

In one embodiment, the gate layer 122 is made of polysilicon. In some embodiments, the gate layer may also be made of silicon oxide, silicon nitride, silicon oxynitride, silicon carbide, silicon carbonitride, silicon oxycarbonitride, or amorphous carbon, etc. In other embodiments, the gate layer may be made of a metal material.

In one embodiment, the semiconductor structure may also include a gate dielectric layer 121 formed between the gate layer 122 and the fins 110.

In one embodiment, the gate dielectric layer 121 is a gate oxide layer; and the gate dielectric layer 121 is made of silicon oxide. In some embodiments, the gate dielectric layer may be made of silicon oxynitride. In other embodiments, when the gate layer is made of a metal material, the gate dielectric layer may be made of a gate dielectric material, such as high-dielectric constant (high-K) material, etc.

In one embodiment, the gate dielectric layer 121 may also cover the surfaces of the fins 110 at both sides of the gate layer 122. In some embodiments, the gate dielectric layer may only be formed between the gate layer and the fins.

The P-type doped epitaxial layer 310 may be used to form the source region or the drain region of the PMOS device. The P-type doped epitaxial layer 310 may be made of Si or SiGe doped with P-type ions. The P-type ions may include at least one of B ions, Ga ions, and In ions, etc. In one embodiment, the P-type doped epitaxial layer 310 may be made of SiGeB.

The N-type doped epitaxial layer 320 may be used as the source region or the drain region of the NMOS device. The N-type doped epitaxial layer 320 may be made of Si or SiC doped with N-type ions. The N-type ions may include at least one of P ions, As ion and Sb ions, etc. In one embodiment, the N-type doped epitaxial layer 320 is made of SiP.

In one embodiment, the semiconductor structure may also include a P-region mask layer 210 formed on the sidewall surfaces of the P-type doped epitaxial layer 310 and N-region covering mask layer 230 formed on the sidewall surfaces of the N-type doped epitaxial layer 320.

The P-region mask layer 210 may be used as an etching mask when forming the P-type doped epitaxial layer 310. The P-region mask layer 210 may be formed between the N-region covering mask layer 230 and the STI structures 101. Further, the portions of the P-region mask layer 210 in the NMOS region II and the N-region covering mask layer 230 may be used as an N-region mask layer. The N-region mask layer may be used as an etching mask when forming the N-type doped epitaxial layer 320.

Correspondingly, in one embodiment, the N-region covering mask layer 230 may cover the P-type doped epitaxial layer 310. For example, the N-region covering mask layer 230 may cover the top surface of the P-type doped epitaxial layer 310 and the P-region mask layer 210 in the PMOS region I and also cover the STI structures 101 and the gate layer 122 in the PMOS region I.

The P-region mask layer 210 may be made of silicon nitride, silicon oxide, boron nitride, or silicon oxynitride, etc. Correspondingly, the N-region mask layer may also be made of silicon nitride, silicon oxide, boron nitride, or silicon oxynitride, etc. In one embodiment, the P-region mask layer 210 is made of silicon nitride; the N-region covering mask layer 230 is made of silicon nitride; and the N-region mask layer is correspondingly made of silicon nitride.

The details of the P-region mask layer 210, the N-region covering mask layer 230 and the N-region mask layer may refer to the previous descriptions.

Referring to FIG. 13, the N-type doped epitaxial layer 320 may be located in the region surrounded by the N-region mask layer and the fins 110 in the NMOS region II. If the height of the fins 110 under the N-type doped epitaxial layer 320 is too large, the depth of the region surrounded by the N-region mask layer and the fins 110 may be too small. Thus, the volume of the N-type doped epitaxial layer 320 may be too small. Accordingly, the resistance of the N-type doped epitaxial layer 320 may be substantially large; and the contact resistance of the NMOS device may be too large. The channel of the NMOS device may be located in the fins 110, if the height of the fins 110 is too small, the performance of the NMOS device may be adversely affected. In one embodiment, the height difference between the top surfaces of the fins 110 under the N-type doped epitaxial layer 320 and the top surfaces of the fins 110 may be in a range approximately from −3 nm to 3 nm.

When the height difference is a negative value, the top surfaces of the fins 110 under the N-type doped epitaxial layer 320 is below the top surfaces of the STI structures 101. When the height difference is a positive value, the top surfaces of the fins 110 under the N-type doped epitaxial layer 320 is above the top surfaces of the STI structures 101.

Similarly, the P-type doped epitaxial layer 310 may be located in the region surrounded by the P-region mask layer 210 and the fins 110 in the PMOS region I. Thus, in one embodiment, the height difference between the top surfaces of the fins 110 under the P-type doped epitaxial layer 310 and the top surfaces of the STI structure 101 may be in a range approximately from −3 nm to 3 nm.

Further, the N-region mask layer on the sidewall surfaces of the fins 110 in the NMOS region II may be processed with a pull-back process. Thus, the volume of the region for forming the N-type doped epitaxial layer 320 may be increased; and the volume of the N-type doped epitaxial layer 320 may be increased. Accordingly, the resistance of the N-type doped epitaxial layer 320 may be increased; the area of the top surface of the N-type doped epitaxial layer 320 may be increased; and the contact resistance of the NMOS device may be increased. Thus, in one embodiment, along the direction perpendicular to the length direction of the fin 110, the width of the N-type doped epitaxial layer 320 may be greater than the width of the fin 110.

Similarly, the P-region mask layer 210 on the sidewall surfaces of the fins 110 in the PMOS region I may be processed with a pull-back process. Thus, the volume of the region for forming the P-type doped epitaxial layer 310 may be increased; and the volume of the P-type doped epitaxial layer 310 may be increased. Accordingly, the resistance of the P-type doped epitaxial layer 310 may be increased; the area of the top surface of the P-type doped epitaxial layer 310 may be increased; and the contact resistance of the PMOS device may be increased. Thus, in one embodiment, along the direction perpendicular to the length direction of the fin 110, the width of the P-type doped epitaxial layer 310 may be greater than the width of the fin 110.

In one embodiment, the portion of the N-type doped epitaxial layer 320 exposed by the N-region mask layer may be processed with an N-type DSS doping process. For example, along the direction from the top surface of the N-type doped epitaxial layer 320 to the bottom of the N-type doped epitaxial layer 320, a partial thickness of N-type doped epitaxial layer 320 (region 325 in FIG. 13) may be doped with certain doping ions.

When the metal silicide layer is formed on the surface of the N-type doped epitaxial layer 320, the process for forming the metal silicide layer may drive the doping ions to segregate at the interface between the metal silicide layer and the N-type doped epitaxial layer 320. Thus, the Schottky barrier height (SBH) of the NMOS device may be reduced. Accordingly, the contact resistance of the NMOS device may be reduced; and the performance of the NMOS device may be improved.

Further, during the N-type DSS doping process, the N-region mask layer may function as a mask to protect the regions are not expected to be affected by the N-type DSS doping process. For example, the PMOS region I may be protected. Thus, when the SBH of the NMOS device is reduced, no extra mask may be needed. Accordingly, the production cost may be reduced. In one embodiment, the doping ions of the N-type DSS doping process may be at least one of P ions, As ions and Sb ions, etc. Because the atomic mass of P atom, As atom and Sb atom may be substantially small, the N-type DSS doping process 321 may achieve a substantially small implanting energy and a substantially large implanting dosage; and the implanting energy and the implanting dosage may be precisely controlled. Thus, when the process effect of the N-type DSS doping process is achieved, the doping damage to the N-type doped epitaxial layer 320 may be avoided.

Thus, in the disclosed embodiment, an N-region mask layer may be formed on the top surfaces and the side surfaces of the fins in the NMOS region. The N-region mask layer may also cover the P-type doped epitaxial layer. After forming the N-region mask layer, the portion of the N-region mask layer in the NMOS region at two sides of the gate layer and a partial thickness of the fins in the NMOS region may be removed by an etching process to form an N-region trench. An N-type doped epitaxial layer may be formed in the N-region trench. After forming a contact opening in the interlayer dielectric layer, an N-type dopant segregate Schottky (DSS) doping process may be performed on the N-type doped epitaxial layer exposed by the N-region trench. During the subsequent process for forming the metal silicide layer, the doping ions doped by the N-type DSS doping process may be drove to segregate at the interface between the metal silicide layer and the N-type doped epitaxial layer. Thus, the SBH of the NMOS device may be reduced; and the performance of the NMOS device may be improved.

Further, during the N-type DSS process, the N-region mask layer may be used as a mask to protect the regions that are not expected to be affected by the N-type DSS doping process. For example, the PMOS region may be protected. Thus, no extra mask may be needed; and the production cost may be reduced.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
   a base substrate including a semiconductor substrate having a PMOS region and an NMOS region and a plurality of fins on the semiconductor substrate;

a gate layer across the plurality of fins by covering portions of top and sidewall surfaces of the fins;

shallow trench isolation structures formed on the semiconductor substrate, top surfaces of the shallow trench isolation structures are lower than top surfaces of the plurality of fins;

a P-type doped epitaxial layer formed in the fins at both sides of the gate layer in the PMOS region;

an N-type doped epitaxial layer formed in the fins at both sides of the gate layer in the NMOS region;

an interlayer dielectric layer formed over the semiconductor substrate exposing the P-type doped epitaxial layer and the N-type doped epitaxial layer; and a metal silicide layer formed on a portion of the P-type doped epitaxial layer and a portion of the N-type doped epitaxial layer not covered by the interlayer dielectric layer;

wherein:

a portion of the N-type doped epitaxial layer exposed by an N-region mask layer is processed by an N-type dopant segregated Schottky doping process to form a doped region on top of a remaining portion of the N-type doped epitaxial layer;

along a direction perpendicular to a length direction of the fin, a width of a bottom of the N-type epitaxial layer is greater than a width of the fin, and a width of a bottom of the P-type epitaxial layer is greater than the width of the fin; and a portion of the metal silicide layer is formed between the bottom of the N-type epitaxial layer and the top surfaces of the shallow trench isolation structures, another portion of the metal silicide layer is formed between the bottom of the P-type epitaxial layer and the top surfaces of the shallow trench isolation structures.

2. The semiconductor structure according to claim 1, wherein:

doping ions of the N-type dopant segregated Schottky doping process include at least one of P ions, As ions and Sb ions.

3. The semiconductor structure according to claim 2, wherein:

the N-type dopant segregated Schottky (DSS) doping process is an ion implantation process;

an implanting energy of the ion implantation process is in a range of approximately 100 eV-1 keV; and an implanting dosage of the ion implantation process is in a range of approximately 1E14 atom/$cm^2$-1E16 atom/$cm^2$.

4. The semiconductor structure according to claim 1, wherein:

a height difference between top surfaces of the fins under the N-type doped epitaxial layer and top surfaces of the shallow trench isolation structures is in range approximately from −3 nm to 3 nm.

5. The semiconductor structure according to claim 1, wherein:

the N-region mask layer is made of one of silicon nitride, silicon oxide, boron nitride, silicon carbonitride, silicon boron oxycarbonitride, and silicon oxynitride.

6. The semiconductor structure according to claim 1, wherein:

a height difference between top surfaces of the fins under the P-type doped epitaxial layer and top surfaces of the shallow trench isolation structures is in range approximately from −3 nm to 3 nm.

7. The semiconductor structure according to claim 1, further comprising:

a contact plug, electrically contacting with the P-type doped epitaxial layer and the N-type doped epitaxial layer.

8. The semiconductor structure according to claim 7, further comprising:

a metal layer formed on the metal silicide layer and the semiconductor substrate; and a barrier layer between the metal layer and the contact plug.

9. The semiconductor structure according to claim 1, wherein:

a top portion of the N-type epitaxial layer is doped with certain doping ions.

10. The semiconductor structure according to claim 1, wherein doping ions of the N-type dopant segregated Schottky doping process include at least one of P ions or As ions.

* * * * *